United States Patent
Murakami et al.

(10) Patent No.: US 8,507,158 B2
(45) Date of Patent: Aug. 13, 2013

(54) PELLICLE FRAME AND PELLICLE CONTAINING SAME

(75) Inventors: Shuichi Murakami, Shizuoka (JP); Takashi Kozeki, Otake (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 36 days.

(21) Appl. No.: 13/383,891

(22) PCT Filed: Jul. 6, 2010

(86) PCT No.: PCT/JP2010/004416
§ 371 (c)(1),
(2), (4) Date: Jan. 13, 2012

(87) PCT Pub. No.: WO2011/007523
PCT Pub. Date: Jan. 20, 2011

(65) Prior Publication Data
US 2012/0122025 A1 May 17, 2012

(30) Foreign Application Priority Data

Jul. 16, 2009 (JP) .................................. 2009-168133

(51) Int. Cl.
*G03F 1/00* (2012.01)
(52) U.S. Cl.
USPC ............................................................ 430/5
(58) Field of Classification Search
USPC ........................................ 430/5, 322; 428/14
See application file for complete search history.

(56) References Cited

U.S. PATENT DOCUMENTS

| 5,470,621 A | 11/1995 | Kashida et al. |
| 5,834,143 A | 11/1998 | Matsuoka et al. |
| 2006/0257754 A1 * | 11/2006 | Harubayashi et al. ............ 430/5 |
| 2007/0292775 A1 | 12/2007 | Hamada |

FOREIGN PATENT DOCUMENTS

| EP | 0 622 680 A2 | 11/1994 |
| JP | 6-301199 A | 10/1994 |
| JP | 7-043892 A | 2/1995 |
| JP | 9-005983 A | 1/1997 |
| JP | 9-166867 A | 6/1997 |
| JP | 2001-212490 A | 8/2001 |
| JP | 2007-333910 A | 12/2007 |

OTHER PUBLICATIONS

International Search Report (PCT/ISA/210) issued on Oct. 19, 2010, by Japanese Patent Office as the International Searching Authority for International Application No. PCT/JP2010/004416.

\* cited by examiner

*Primary Examiner* — Stephen Rosasco
(74) *Attorney, Agent, or Firm* — Buchanan Ingersoll & Rooney PC (57) ABSTRACT

Provided is a pellicle that has appropriate membrane strength, high resistance to chemicals, and a low degree of sulfate ion generation and outgassing. A provided pellicle frame supports the outer rim of a pellicle membrane, and an epoxy resin coating is formed on the surface of the pellicle frame. In the infrared absorption spectrum of said epoxy resin coating, the ratio of the absorbance of a peak in the range between 1450 $cm^{-1}$ and 1550 $cm^{-1}$ to the absorbance of a peak in the range between 1200 $cm^{-1}$ and 1275 $cm^{-1}$ is at least 0.5 and at most 3; also, the ratio of the absorbance of a peak in the range between 1450 $cm^{-1}$ and 1550 $cm^{-1}$ to the absorbance of a peak in the range between 905 $cm^{-1}$ and 930 $cm^{-1}$ is at least 1 and less than 7.

10 Claims, 5 Drawing Sheets

TABLE 2

| ①SAMPLE | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 | COMPARATIVE EXAMPLE 8 |
|---|---|---|---|---|---|---|---|---|
| PELLICLE FRAME MATERIAL (ALUMINUM) | AL FRAME 7075 | AL FRAME 7075 | AL FRAME 5052 | AL FRAME 7075 | AL FRAME 7075 | AL FRAME 7075 | AL FRAME 5052 | AL FRAME 5052 |
| ELECTRODEPOSITION PAINT SUPPLIER | NIPPON PAINT CO., LTD. | SHIMIZU CO., LTD. | SHIMIZU CO., LTD. | — | — | NIPPON PAINT CO., LTD. | NIPPON PAINT CO., LTD. | NIPPON PAINT CO., LTD. |
| ELECTRODEPOSITION PAINT | POWER SQUARE | AM-1 | W-2 | SILANE-BASED | ANODIZED FILM | CPY9-2 | CPY9-3 | CPY9-4 |
| ②ELECTRODEPOSITION COATING CONDITION | | | | | | | | |
| LIQUID TEMPERATURE (°C) | 20 | 20 | 20 | | | 20 | 20 | 20 |
| APPLIED VOLTAGE (V) | 200 | 200 | 200 | | | 200 | 200 | 200 |
| ENERGIZATION TIME (s) | 30 | 30 | 30 | | | 30 | 30 | 30 |
| ③ | | | | | | | | |
| THICKNESS (μm) | 2.5 | | | | | | | |
| ④DATA | | | | | | | | |
| ①GENERATED GAS AMOUNT (μg/3 FRAMES) | 2820.960 | 2332.960 | 2202.960 | 1185.960 | — | 2536.960 | 2173.960 | 2233.960 |
| ②SULFATE ION AMOUNT (μg) | GREEN | GREEN | GREEN | GREEN | | GREEN | GREEN | GREEN |
| ③ABRASION TEST (BEFORE SOLVENT IMMERSION) | | | | | | | | |
| SURFACE OBSERVATION AFTER ABRASION TEST | WORN OFF | WORN OFF | WORN OFF | WORN OFF | 0 | WORN OFF | WORN OFF | WORN OFF |
| WIDTH OF REMAINING COATING (mm) | 4 | 3 | 3 | 2 | 10 | 3 | 4 | 4 |
| ④ABRASION TEST (AFTER SOLVENT IMMERSION) | | | | | | | | |
| SURFACE OBSERVATION AFTER ABRASION TEST | WORN OFF | WORN OFF | WORN OFF | WORN OFF | — | WORN OFF | WORN OFF | WORN OFF |
| WIDTH OF REMAINING COATING (mm) | 4 | 3 | 3 | 2 | — | 3 | 4 | 4 |
| DERIVED FROM BENZENE RING, PEAK A | 0.17 | 0.11 | 0.08 | — | — | 0.15 | 0.06 | 2.3 |
| DERIVED FROM EPOXIDE RING, PEAK B | 0.08 | 0.06 | — | — | — | 0.08 | 0.13 | 0.08 |
| ⑤IR ABSORBANCE DERIVED FROM METHYL, PEAK C | — | — | — | — | — | 0.15 | 0.08 | 0.04 |
| DERIVED FROM NH BOND, PEAK D | — | — | 0.08 | — | — | 0.22 | 0.06 | 1.10 |
| | — | — | 0.7 | — | — | 0.7 | 1.5 | 0.07 |
| | | | | | | | | 0.9 |

PELLICLE FRAME AND PELLICLE CONTAINING SAME

TECHNICAL FIELD

The present invention relates to a pellicle frame and a pellicle having the same, more particularly to a pellicle that is attached to a lithography mask upon exposure with light at a wavelength of substantially 500 nm or less in the manufacturing process of semiconductor devices (e.g., LSIs and SLSIs) or liquid crystal display panels.

BACKGROUND ART

In the manufacturing process of semiconductor devices (e.g., LSIs and SLSIs) or liquid crystal display panels, light is applied through a mask (photomask) to print patterns. When any particle is attached to the mask, it may absorb or deflect the radiation and cause deformation of features or makes the edge of the features rugged, resulting in poor dimensional accuracy, poor quality and poor appearance. To avoid this problem, a pellicle with good light transmittance is attached to the mask surface so as to prevent possible attachment of particle to the mask surface.

A pellicle usually has a metallic pellicle frame and a pellicle membrane attached with an adhesion to one end surface of the frame. The other end surface of the pellicle frame has an adhesion layer for fixing the pellicle to a photomask. The adhesive layer is protected by, for example, sheet-shaped material having releasability (separator).

A pellicle that has been checked for the absence of any particle on the pellicle membrane is shipped or transported while being hermetically packaged in a given container under strict conditions so as to avoid inclusion of particle.

The pellicle frame is usually made of aluminum alloy. Among other aluminum alloys, black anodized aluminum alloy has been employed in order to meet the requirements indispensable for pellicles: 1) black color for preventing stray light; 2) lightness and high strength; 3) high surface hardness; and so forth.

The black anodized layer formed on the aluminum alloy surface has many asperities on the surface and is porous, hard and brittle. Thus, in some cases, force and vibration generated during the manufacturing process of a pellicle, or frictional force between the shipping case and pellicle frame generated during the transportation of the pellicle cause dust generation due to scattering of dust and black pigment particles present on the asperities or in the pores of the black anodized layer or due to destruction of the brittle black anodized layer surface.

One proposed method of preventing such dust generation is to smooth the entire surface of a pellicle frame by dip coating with a non-adhesive transparent organic polymer or non-adhesive transparent fluorine organic polymer, which have good light resistance (see, e.g., Patent Literature 1).

Another proposed method is to form acrylic resin coating on the surface of an aluminum pellicle frame by cationic electrodeposition coating (see, e.g., Patent Literature 2).

Still another proposed method is to electrodeposit polymer coating such as acrylic resin or epoxy resin coating on the surface of an aluminum pellicle frame (see, e.g., Patent Literature 3).

CITATION LIST

Patent Literature

[PTL 1] Japanese Patent Application Laid-Open No. 06-301199

[PTL 2] Japanese Patent Application Laid-Open No. 07-43892

[PTL 3] Japanese Patent Application Laid-Open No. 2007-333910

SUMMARY OF INVENTION

Technical Problem

The pellicle frame disclosed by Patent Literature 1 is manufactured by coating the surface of a black anodized matte-finish pellicle frame with clear, colorless resin. Thus, when the coating has flaked off due to friction or other force, residual Sulfuric acid used in the anodizing process may be generated. Sulfate ions can form particle by reaction with ammonia. When outgas such as sulfuric acid gas is generated from the pellicle frame, there is concern that the gas undergoes decomposition in the lithography process to hinder precise patterning.

Due to their low affinity for aluminum, fluorine polymer coatings are likely to separate from aluminum at the interface. Specifically, the solubility parameter (unit: $(cal/cm^3)^{1/2}$) of fluorine polymer is of the order of 3 to 7.6, whereas the corresponding value for aluminum alloy is 72—a large solubility parameter difference (general polymers in paints have a solubility parameter of 7 to 10). The larger the difference in solubility parameter, the lower the affinity between the two materials and thus the more likely separation occurs at the interface. Thus, fluorine polymer coatings are likely to flake off due to friction and generate dust.

Manufacturing the pellicle frames disclosed by Patent Literatures 2 and 3 does not necessarily require anodizing, and therefore, liberation of sulfuric acid can be reduced. However, the acrylic resin-based electrodeposited coatings disclosed in Patent Literatures 2 and 3 have low film strength. Accordingly, vibration or mechanical shock during the manufacture, transportation by truck, train or airplane or unloading of pellicles may cause the coating to flake off, resulting in generation of dust (particle) that may be attached to the pellicle membrane.

Moreover, acrylic resin-based electrodeposited coatings have low chemical resistance. Specifically, even the presence of trace amounts of dust during the electrodeposition coating process in a non-clean room or after the electrodeposition coating process results in attachment of dust on the electro-coated pellicle frame, because the electrodeposited coatings are organic coatings and therefore are likely to be electrically charged. In order to remove dust, the electrocoated frame may be washed with water or organic solvent such as acetone or tetra-hydro furan (hereinafter "THF"). When a pellicle frame electrocoated with acrylic resin has been immersed in an organic solvent, the acrylic resin coating may later flake off, resulting in dust generation.

As described above, no pellicle frames have been available in the art that produce less sulfate ions or outgassing and have moderate film strength and high chemical resistance. It is therefore an object of the present invention to provide a pellicle, frame that produces less sulfate ions or outgassing and has moderate film strength and high chemical resistance, and a pellicle having the same.

Solution to Problem

The inventors established that a balance between rigidity and flexibility of coating is important in order to enhance film strength of the coating and adhesion between the coating and pellicle frame. The inventors found that the balance between rigidity and flexibility is indicated in terms of specific peak strength ratios in an infrared absorption spectrum of the coating, and that the peak strength ratios can be adjusted based on the chemical structure of a cured product of epoxy resin in the coating. The present invention has been accomplished based on these findings.

[1] A pellicle frame for supporting a periphery of a pellicle membrane, including:
  an epoxy resin coating formed on a surface of the pellicle frame,
  wherein, in an infrared absorption spectrum of the epoxy resin coating, a ratio of an absorbance of peak B in a range between 1450 cm$^{-1}$ and 1550 cm$^{-1}$ to an absorbance of peak A in a range between 1200 cm$^{-1}$ and 1275 cm$^{-1}$ is 0.5 to 3, and a ratio of an absorbance of a peak B in a range between 1450 cm$^{-1}$ and 1550 cm$^{-1}$ to an absorbance of a peak C in a range between 905 cm$^{-1}$ and 930 cm$^{-1}$ is 1 to less than 7.
[2] The pellicle frame according to [1] above, wherein the epoxy resin coating is a cured product of an electrodeposited coating of epoxy resin containing a cationic epoxy compound.
[3] The pellicle frame according to [1] or [2] above, wherein the epoxy resin contains a bisphenol epoxy compound modified with an amine.
[4] The pellicle frame according to any one of [1] to [3] above, wherein the pellicle frame is a non-anodized aluminum alloy frame.
[5] The pellicle frame according to any one of [1] to [4], wherein the epoxy resin coating has a thickness of 25 μm or less.
[6] A pellicle including:
  a pellicle membrane; and
  the pellicle frame according to any one of [1] to [5] for supporting a periphery of the pellicle membrane.

Advantageous Effects of Invention

According to the present invention, it is possible to provide a pellicle that produces less sulfuric acid and outgassing and has less haze caused by sodium sulfate derived from residual sulfuric acid. According to the present invention, it is also possible to provide a pellicle that has moderate film strength and high chemical resistance. The present invention thus can prevent flacking off of coatings due to shock, friction or solvent immersion and thus can highly prevent dust generation.

DESCRIPTION OF EMBODIMENTS

Epoxy resin coating in the present invention, which is formed on a pellicle frame, can be formed by a variety of techniques, including dip coating, spray coating, or electrodepostion coating; however, electrodeposition coating is preferable in view of its easiness in controlling film thickness. Electrodeposition coating techniques include cationic electrodeposition coating and anionic electrodeposition coating. In this embodiment, description is given in which an epoxy resin coating on the pellicle frame surface is formed by cationic electrodeposition coating.

1. Cationic Electrodeposition Paint Composition

An epoxy resin-based cationic electrodeposition paint composition used in the present invention contains (A) cationic epoxy compound, (B) curing agent, (C) pigment, (D) neutralizer and (E) aqueous medium, and optionally, (F) additional component(s).

(A) Cationic Epoxy Compound

The cationic epoxy compound is obtained by cationic modification of an oligomer containing polyvalent alcohol and epichlorohydin as monomer units.

The polyvalent alcohol, a monomer unit of an oligomer, preferably includes a phenol derivative. Examples of the phenol derivative include bisphenol, phenol novolac, and cresol novolac, with bisphenol being more preferable.

Bisphenol has the following general formula (1), for example. In general formula (1), X is single bond, —CH$_2$—, —CH(CH$_3$)—, —C(CH$_3$)$_2$—, —C(CH$_3$)(C$_2$H$_5$)—, —C(CH$_3$)(C$_6$H$_5$)—, —O—, —S— or —SO$_2$—, preferably —CH$_2$— or —C(CH$_3$)$_2$—; R$_1$s are independently halogen atom such as fluorine, chlorine, bromine or iodine, or phenyl group; and p is the number of substituent R$_1$, which is an integer of 0 to 4. Examples of compounds having general formula (1) include compounds having four bromine substitutents as R$_1$s attached at the ortho positions with respect to the hydroxyl groups.

The polyvalent alcohol, a monomer unit of an oligomer, may include other polyvalent alcohol together with bisphenol. Examples of the other polyvalent alcohol include polyvalent phenols and aliphatic polyvalent alcohols.

Examples of the polyvalent phenols include 1,2-benzenediol, 1,3-benzenediol, 1,4-benzenediol, and 1,3,5-trihydroxybenzene. Examples of the aliphatic polyvalent alcohols include glycol.

Oligomers containing bisphenol and epichlorohydin as monomer units are commercially available. Examples of commercial products of bisphenol A epoxy compounds include EPIKOTE 828 (Yuka Shell Epoxy K.K., epoxy equivalent: 180 to 190 g/eq), EPIKOTE 1001 (Yuka Shell Epoxy K.K., epoxy equivalent: 450 to 500 g/eq), and EPIKOTE 1010 (Yuka Shell Epoxy K.K., epoxy equivalent: 3,000 to 4,000 g/eq). Examples of commercial products of bisphenol F epoxy compounds include EPIKOTE 807 (Yuka Shell Epoxy K.K., epoxy equivalent: 170 g/eq).

As described above, the cationic epoxy compound is a compound obtained by cationic modification of an oligomer containing polyvalent alcohol and epichlorohydin as monomer units. Although all of the epoxy rings contained in the oligomer may be cationically modified, it is preferable to cationically modify only some of them and leave some intact.

Cationic modification means to cause ring-opening addition reaction of epoxy rings to take place by reaction with an active hydrogen compound. Examples of the active hydrogen compound include amines and acid salts thereof, sulfides, and acid mixtures. Two or more different active hydrogen compounds may be combined for cationic modification of oligomer.

The active hydrogen compounds used for cationic modification preferably include amines and acid salts thereof. Modification by means of amine is referred to as amine modification. The amines may be any of primary, secondary and tertiary amines Examples of the amines and acid salts thereof include butylamine, octylamine, diethylamine, dibutyl amine, methylbutylamine, monoethanolamine, diethanolamine, N-methylethanolamine, N-ethylethanolamine, triethylamine, N,N-dimethylbenzylamine and N,N-dimethylethanolamine, and acid salts thereof.

The number-average molecular weight of an amine-modified epoxy compound is preferably 1,500 to 5,000, more preferably 1,600 to 3,000. When the number-average molecular weight is less than 1,500, a cured film made of amine-modified epoxy compound may have poor solvent resistance. On the other hand, when the number-average molecular weight exceeds 5,000, it becomes difficult to control viscosity of resin solution. The number-average molecular weight of the amine-modified epoxy compound can be measured by gel permeation chromatography (GPC).

As will be detailed later, in an infrared absorption spectrum of a cured product of a cationic electrodeposition paint composition used in the present invention, 1) the ratio of the absorbance of peak B derived from benzene ring (absorbance of a peak in the range between 1450 $cm^{-1}$ and 1550 $cm^{-1}$) to the absorbance of peak A derived from ether bound to the benzene ring (absorbance of a peak in the range between 1200 $cm^{-1}$ and 1275 $cm^{-1}$), and 2) the ratio of the absorbance of peak B derived from benzene ring to the absorbance of peak C derived from non-reacted epoxy group (absorbance of a peak in the range between 905 $cm^{-1}$ and 930 $cm^{-1}$) are preferably within specific ranges, respectively.

The ratio of the absorbance of peak B derived from benzene ring to the absorbance of peak A derived from ether bound to the benzene ring may be adjusted by changing the polyvalent alcohol structure and polyvalent alcohol composition of oligomer. For example, the absorbance of peak A derived from ether bound to the benzene ring can be increased when bisphenol having general formula (1) has oxygen atom for X, and the absorbance of peak B derived from benzene ring can be increased when X is —C(CH$_3$)C$_6$H$_5$)— or R$_1$ is phenyl group. The absorbance of peak A derived from ether bound to the benzene ring can also be increased when some of the polyvalent alcohol monomer units are replaced by benzene diol, and the absorbance of peak B derived from benzene ring relatively decreases when some of the polyvalent alcohol monomer units are replaced by aliphatic polyvalent alcohol.

The ratio of the absorbance of peak B derived from benzene ring to the absorbance of peak C derived from non-reacted epoxy group can be adjusted based on the degree of cationic modification, for example. Namely, the absorbance of peak C increases with increasing remaining ratio of epoxy rings by lowering the degree of cationic modification.

Although it is only necessary to adjust the degree of cationic modification so that the above peak absorbance ratios can be attained, the epoxy equivalent of the cationic epoxy compound is preferably 300 to 3,000 g/eq. On the other hand, the amine equivalent of the amine-modified epoxy compound is preferably 30 to 80 meq per 100 g.

(B) Curing Agent

The curing agent is used for curing the cationic epoxy compound, and is preferably a blocked isocyanate curing agent.

As the blocked isocyanate curing agent, blocked polyisocyanates are preferable, which are prepared by blocking of polyisocyanates with a blocking agent. Polyisocyanates refers to compounds having more than one isocyanate group per molecule.

Examples of the polyisocyanates include aromatic diisocyanates such as tolylene diisocyanate (TDI), diphenylmethane diisocyanate (MDI), p-phenylene diisocyanate, and naphthalene diisocyanate; C$_{3-12}$ aliphatic diisocyanates such as hexamethylene diisocyanate (HDI), 2,2,4-trimethylhexane diisocyanate, and lysine diisocyanate; C$_{5-18}$ alicyclic diisocyanates such as 1,4-cyclohexane diisocyanate (CDI), isophorone diisocyanate (IPDI), 4,4'-dicyclohexylmethane diisocyanate (hydrogenated MDI), methylcyclohexane diisocyanate, isopropylidene dicyclohexyl-4,4'-diisocyanate, and 1,3-diisocyanatomethylcyclohexane (hydrogenated XDI), hydrogenated TDI, 2,5- or 2,6-bis(isocyanatemethyl)-bicyclo[2.2.1]heptane (also referred to as norbornane diisocyanate); and aromatic ring-containing aliphatic diisocyanates such as xylylene diisocyanate (XDI) and tetramethylxylylene diisocyanate (TMXDI). These polyisocyanates can be used alone or in combination.

The blocking agent refers to an agent that adds to isocyanate groups of a polyisocyanate, remains stable at room temperature, and on heating to the temperature of dissociation or above may give free isocyanate groups.

Preferable examples of the blocking agent include lactam blocking agents such as ε-caprolactam, δ-valerolactam, γ-butyrolactam and β-propiolactam; and oxime blocking agents such as formaldoxime, acetaldoxime, acetoxime, methyl ethyl ketoxime, diacetylmonoxime, and cyclohexaneoxime.

The curing agent content needs to be high enough so that it reacts with the amine groups of the amine-modified epoxy compound to afford good cured coating. In general, the weight ratio of the amine-modified epoxy compound to the blocked isocyanate curing agent (amine-modified epoxy compound/blocked isocyanate curing agent) is preferably 90/10 to 50/50, more preferably 80/20 to 65/35. The total amount of the amine-modified epoxy compound and blocked isocyanate curing agent is 25 wt % to 85 wt %, preferably 40 wt % to 70 wt %, based on the total solid content of the electrodeposition paint composition.

(C) Pigment

The cationic electrodeposition paint composition used in the present invention contains carbon black as a black pigment. This is to facilitate confirmation of dust by suppressing stray light in the acceptance testing of pellicle frames, where the pellicle frame is irradiated with light to check for the presence of dust based on the reflection of light.

The pigment content is generally 1 wt % to 35 wt %, preferably 10 wt % to 30 wt %, based on the total solid content of the electrodeposition paint composition.

(D) Neutralizer

The cationic electrodeposition paint composition used in the present invention contains a neutralizer for improving dispersibility of the cationic epoxy compound into aqueous medium.

Examples of the neutralizer include inorganic acids such as hydrochloric acid, nitric acid, phosphoric acid, formic acid, acetic acid and lactic acid, and organic acids. The neutralizer content in the electrodeposition paint composition is such that at least 20%, preferably 30% to 60%, of the amine-modified epoxy compound is neutralized (i.e., neutralization ratio is 20%, preferably 30% to 60%).

(E) Aqueous Medium

The aqueous medium is, for example, ion-exchange water or pure water. The aqueous medium may contain small amounts of alcohol or the like as needed.

(F) Additional Component

The cationic electrodeposition paint composition used in the present invention may contain additional component(s) as needed. Examples of the additional components include water-miscible organic solvents, surfactants, antioxidants, UV absorbers, and curing catalysts for facilitating dissociation of the blocking agent for the curing agent. Examples of the curing catalysts include tin catalysts.

The cationic electrodeposition paint composition used in the present invention may be either an electrodeposition paint composition prepared from the above components (A) to (F), or a commercially available electrodeposition paint composition. Examples of the commercially available electrodeposition paint composition include Power Top U-CP70 (Nippon Paint Co., Ltd.), epoxy resin for electrodeposition coating.

2. Electrodeposition Coating Method and Cured Electrodeposited Coating

An epoxy resin-based cured electrodeposited coating on the surface of a pellicle frame, of the present invention is obtained by a method including the steps of: 1) forming an electrodeposited coating of the cationic electrodeposition paint composition on the surface of a pellicle frame; and 2) thermally curing the electrodeposited coating followed by drying to afford cured electrodeposited coating.

Examples of materials for the pellicle frame include metals such as aluminum, aluminum alloys and magnesium alloys. Preferably, the pellicle frame is not subjected to any treatment, by which to form an anodic oxidation coating by means of sulfuric acid (e.g., anodizing treatment). The reason for this is to prevent sulfuric acid used in the anodizing treatment from remaining on the pellicle frame.

Prior to the formation of electrodeposited coating, the pellicle frame surface is preferably subjected to pre-treatment.

Examples of the pre-treatment include plasma treatment and roughening treatment such as sand blast treatment. By roughening the pellicle frame surface, the surface of the cured electrodeposited coating is made matte (gloss is eliminated). Sand blast treatment may be carried out using, for example, #300 sand such that surface roughness (average surface roughness Ra) is 4 to 6 μm. In this way light reflection is suppressed, thereby facilitating checking for surface contamination. Other examples of the pre-treatment include washing, whereby particle or oil attached to the surface is preferably removed.

In the step 1), a metallic pellicle frame, a coating target, is immersed in an electrodeposition vessel charged with the cationic electrodeposition paint composition. Voltage is then applied between the pellicle frame (negative electrode) and positive electrode, allowing epoxy resin to be deposited onto the surface of the pellicle frame. In this way electrodeposited coating made of uncured epoxy resin is obtained.

Electrodeposition coating is preferably carried out at 100V to 220V for energization time of 30 to 240 seconds.

The thickness of the electrodeposited coating is preferably 5 μm to less than 30 μm, more preferably 7 μm to 25 μm. When the electrodeposited coating is too thin, it results in insufficient cohesive strength in the resin coating, making it difficult to attain a desired level of resin strength. On the other hand, when the electrodeposited coating is too thick, the coating surface may become coarse to an extent that gives an orange peel surface finish, making it difficult to attain uniform coating thickness along with poor surface smoothness. The thickness of the electrodeposited coating can be adjusted based on voltage or energization time during the electrodeposition coating process.

The pellicle frame on which electrodeposited coating is formed in step 1) is then washed with water. In the subsequent step 2), the pellicle frame is baked at 120° C. to 260° C., more preferably 140° C. to 220° C., for 10 to 30 minutes to thermally cure the electrodeposited coating to afford cured electrodeposited coating.

Figure 1:
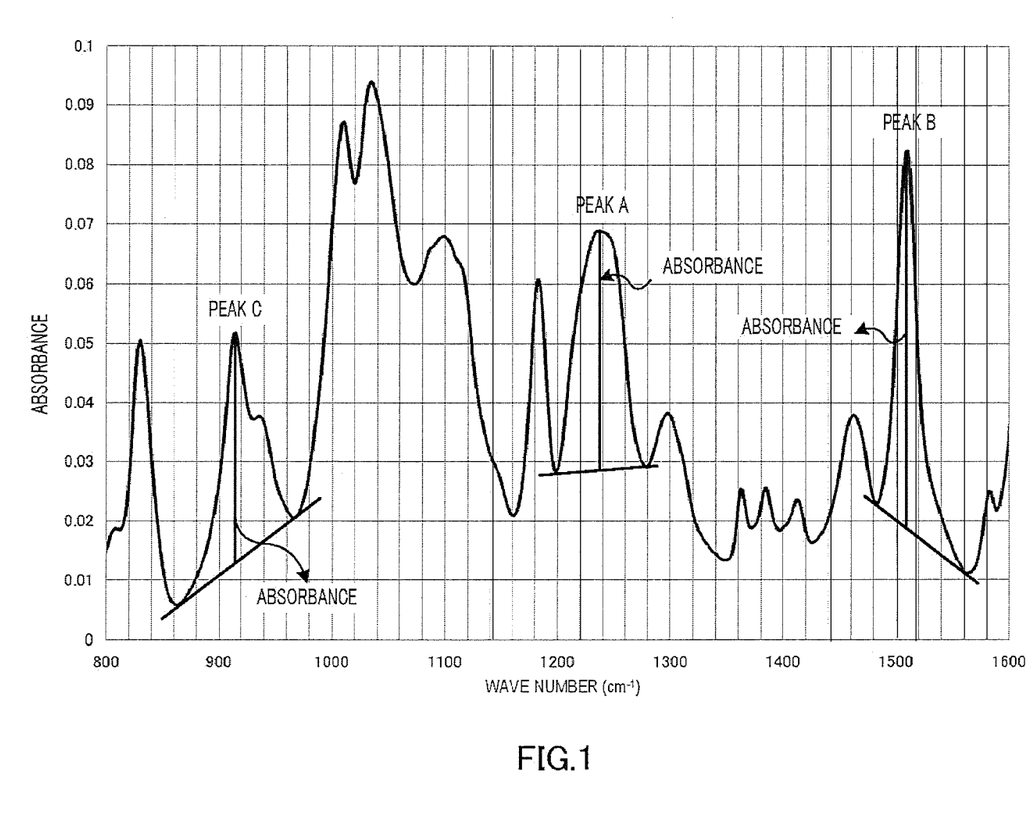
FIG. 1 shows an example of an infrared absorption spectrum of epoxy resin-based cured electrodeposited coating according to an embodiment of the present invention.

FIG. 1 shows an example of an infrared absorption spectrum of the cured electrodeposited coating. Referring to FIG. 1, in the infrared absorption spectrum of the cured electrodeposited coating, peak A in the range between 1200 $cm^{-1}$ and 1275 $cm^{-1}$, peak B in the range between 1450 $cm^{-1}$ and 1550 $cm^{-1}$, and peak C in the range between 905 $cm^{-1}$ and 930 $cm^{-1}$ are observed. Peaks A to C are the most intensive absorption peaks (highest peaks) in their respective wave number ranges in the spectrum.

Peak A in the range between 1200 $cm^{-1}$ and 1275 $cm^{-1}$ is derived from ether bound to the benzene ring of epoxy resin and serves as a measure of flexibility of bonds in the epoxy resin. Peak B in the range between 1450 $cm^{-1}$ and 1550 $cm^{-1}$ is derived from benzene ring and serves as a measure of rigidity of bonds in the epoxy resin. Peak C in the range between 905 $cm^{-1}$ and 930 $cm^{-1}$ is derived from non-reacted epoxy group and serves as a measure of adhesion to aluminum and reactivity with a curing agent.

In the infrared absorption spectrum, the ratio of the absorbance of peak B in the range between 1450 $cm^{-1}$ and 1550 $cm^{-1}$ to the absorbance of peak A in the range between 1200 $cm^{-1}$ and 1275 $cm^{-1}$ (B/A) is preferably 0.5 to 3. An absorbance ratio (B/A) of less than 0.5 means the high abundance of ether groups bound to the benzene rings. Thus, it may become difficult to attain sufficient resin strength because the cured electrodeposited coating becomes too soft. On the other hand, an absorbance ratio (B/A) of greater than 3 means the high abundance of benzene rings. Thus, the cured electrodeposited coating may flake off because the coating becomes hard and brittle. More preferably, the absorbance ratio B/A is 0.7 to less than 2.8, and further preferably 0.8 to less than 2.6.

In the infrared absorption spectrum, the ratio of the absorbance of peak B in the range between 1450 $cm^{-1}$ and 1550 $cm^{-1}$ to the absorbance of peak C in the range between 905 $cm^{-1}$ and 930 $cm^{-1}$ (B/C) is preferably 1 to less than 7. An absorbance ratio (B/C) of less than 1 means the high abundance of non-reacted epoxy groups (i.e., lesser abundance of amine groups that react with a curing agent). Thus, it may result in failure to attain sufficient resin strength because the cured electrodeposited coating has low crosslink density. On the other hand, an absorbance ratio (B/C) of greater than 7 means the lesser abundance of non-reacted epoxy groups. Thus, the cured electrodeposited coating may have low abrasion resistance because of the reduced adhesion between the coating and aluminum alloy frame. More preferably, the absorbance ratio (B/C) is 1 to less than 6, further preferably 1 to less than 4.

Thus, it is preferable to form such a cured electrodeposited coating having such concentrations of benzene ring-bound ether and benzene ring that the ratio of the absorbance of peak B in the range between 1450 $cm^{-1}$ and 1550 $cm^{-1}$ to the absorbance of peak A in the range between 1200 $cm^{-1}$ and 1275 $cm^{-1}$ (B/A) is within the above optimal range. Similarly, it is preferable to form such a cured electrodeposited coating having such concentrations of epoxy group and benzene ring that the ratio of the absorbance of peak B in the range between 1450 cm$^{-1}$ and 1550 cm$^{-1}$ to the absorbance of peak C in the range between 905 cm$^{-1}$ and 930 cm$^{-1}$ (B/C) is within the above optimal range.

The absorbance in the infrared absorbance spectrum of the cured electrodeposited coating is measured as described below. It should be noted that although absorption intensity in a transmission spectrum may be employed for the measurement of an infrared absorption spectrum, absorbance is employed in the present invention.

A cured electrodeposited coating formed on the surface of a pellicle frame is scraped into powder form with a cutter knife or other cutting tool. The infrared absorption spectrum of the coating powder is measured by the KBr tablet method. More specifically, the coating powder is mixed with fine KBr powder and compressed into a tablet. The concentration (measurement concentration) of the coating powder in the tablet is set at 1 to 10 mg/g, preferably 1 mg/g. Using an infrared spectrum analyzer, infrared absorption spectroscopy is carried out over a wave number range of 400 cm$^{-1}$ to 4,000 cm$^{-1}$ to measure an infrared absorption spectrum (absorbance vs. number of wavelength) as shown in FIG. 1.

Regarding the maximum peak in the respective wave number range (between 905 cm$^{-1}$ and 930 cm$^{-1}$, between 1450 cm$^{-1}$ and 1550 cm$^{-1}$ or between 1200 cm$^{-1}$ and 1275 cm$^{-1}$) in the infrared absorption spectrum shown in FIG. 1, pair of valleys adjacent to the maximum peaks is focused. A linear base line is drawn that connects the pair of valleys. The positions of the two valleys may fall outside the above wave number range. The absorbance of peak is then calculated by subtracting a value of the absorbance at the wavelength on the base line which wave number corresponds to peak top from a value of the absorbance at peak top (highest absorbance in the corresponding wavelength range). In FIG. 1, the absorbance of peak A is approximately 0.04, the absorbance of peak B is approximately 0.06, and the absorbance of peak C is approximately 0.04.

The valley from which a base line is drawn should be the first inflection point following the maximum peak. Namely, the absorption spectrum has peaks and valleys that come after each other, and the valleys are considered as inflection points. A shoulder portion, which shows a gentle descending slope without any distinct inflection point, is not deemed as an inflection point herein.

The cured electrodeposited coating is almost as thick as the electrodeposited coating; thickness is preferably 5 μm to less than 30 μm, more preferably 7 μm to less than 25 μm.

The cured electrodeposited coating obtained in the present invention has good adhesion to the pellicle frame surface and moderate film strength. Even after immersed into an organic solvent such as tetra-hydro furan (TFT), the cured electrodeposited coating has good adhesion to the pellicle frame surface and moderate film strength.

The pellicle frame formed with the cured electrodeposited coating is then checked for the presence of dust in the acceptance testing of pellicle frames or in the shipping inspection of pellicles, a product in which a pellicle membrane is stretched over the pellicle frame.

In the acceptance testing of pellicle frames, the pellicle frame is irradiated with intense light to check for the presence of dust based on light reflection. If any invisibly small dust is present, the pellicle frame glints in a ray of light. Only pellicle frames that showed no light reflection can pass the acceptance testing.

Conventional acrylic resin-based cured electrodeposited coatings are not matte and therefore are glossy. In order for these coatings to be adapted to the acceptance testing of pellicle frames, inorganic substance is added to the electrodeposited coatings. The epoxy resin-based cured electrodeposited coatings obtained in the present invention, by contrast, are adapted for the acceptance testing of pellicle frames because they have good matte finish without containing any inorganic substance.

3. Pellicle

Figure 2:
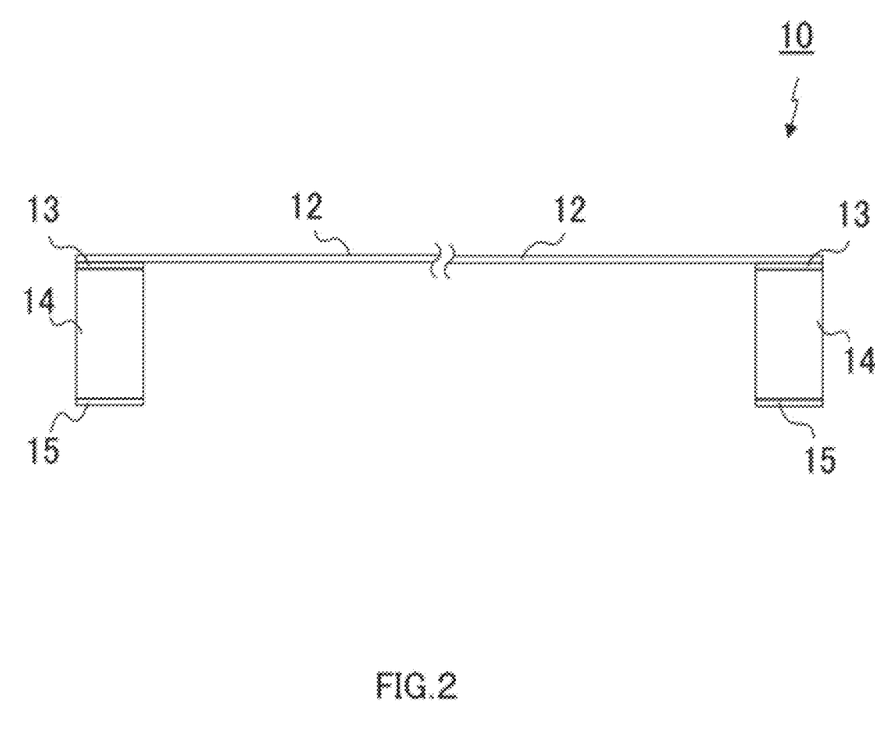
FIG. 2 is a schematic illustration of a pellicle according to an embodiment of the present invention.
Figure 3:
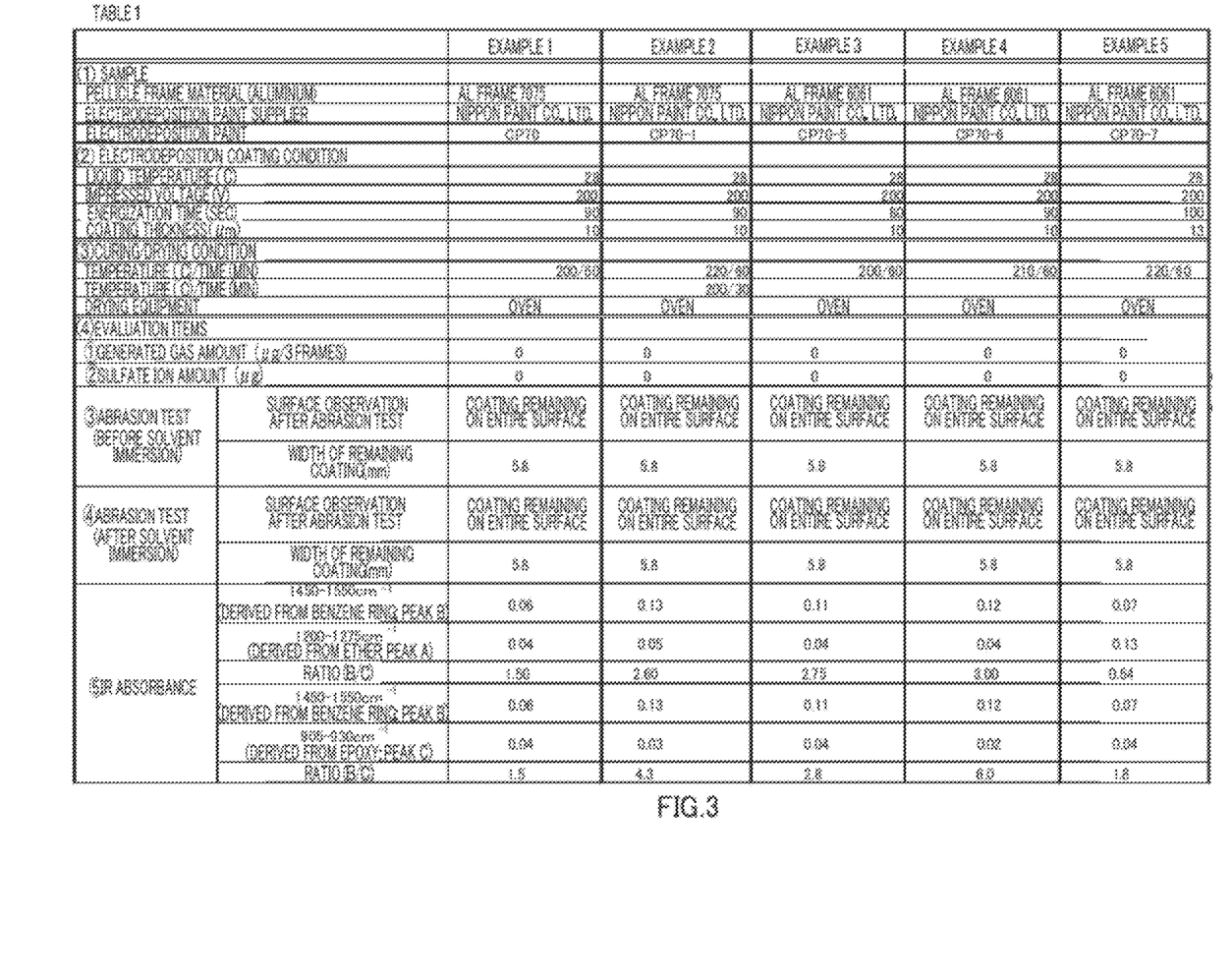
FIG. 3 is a table showing the results of Examples of present invention.
Figure 4:
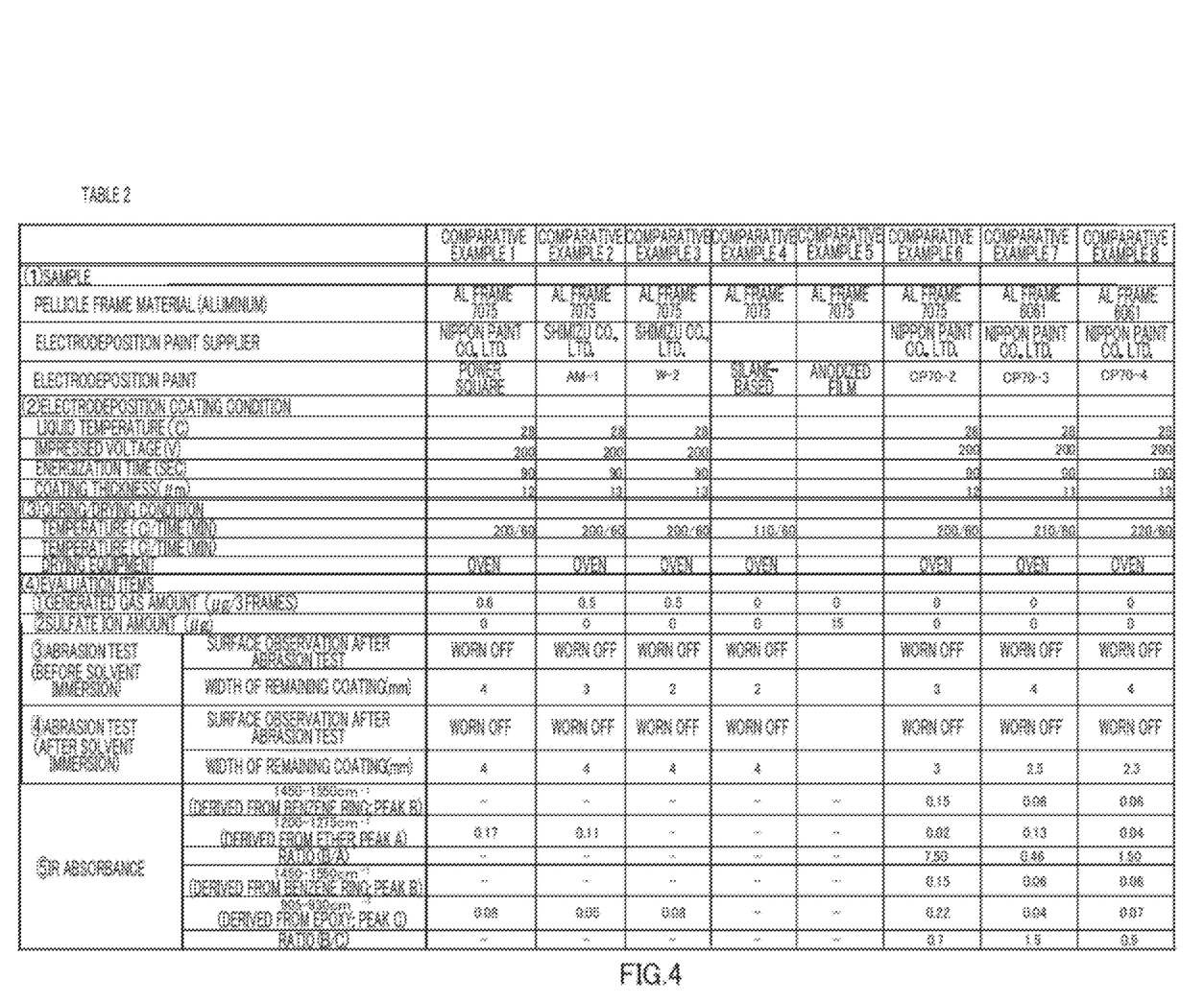
FIG. 4 is a table showing the results of Comparative Examples of the present invention.

A pellicle of the present invention includes a pellicle membrane, a pellicle frame for supporting the periphery of the pellicle membrane, a membrane adhesive for bonding the pellicle frame to the pellicle membrane, and a mask adhesive for bonding the pellicle frame to a mask. FIG. 2 depicts a pellicle according to an embodiment of the present invention. Pellicle 10 includes pellicle membrane 12 and pellicle frame 14 for supporting the periphery of pellicle membrane 12. Pellicle membrane 12 is stretched over pellicle frame 14 via membrane adhesive layer 13 provided on one end surface of pellicle frame 14. In order to bond pellicle frame 14 to a mask (not shown), mask adhesive layer 15 is provided on the other end surface of pellicle frame 14.

Pellicle membrane 12 is supported by pellicle frame 14 and covers the exposure area of a mask (not shown). Thus, pellicle membrane 12 is transparence enough not to block energy conduction by exposure. Examples of materials for pellicle membrane 12 include transparent materials such as quartz glass, fluoro-polymer, and cellulose acetate.

Pellicle frame 14 includes the above-described epoxy resin-based cured electrodeposited coating formed on the surface. Desirably, the cured electrodeposited coating is black. The reason for this is to prevent reflection of exposed light as well as to facilitate checking for particle attached on the surface.

Membrane adhesive layer 13 bonds pellicle frame 14 to pellicle membrane 12. Mask adhesive layer 15 bonds pellicle frame 14 to a mask (not shown).

Membrane adhesive layer 13 is, for example, an acrylic resin adhesive, an epoxy resin adhesive, a silicone resin adhesive, or a fluorine polymer such as a fluorine-containing silicone adhesive. Mask adhesive layer 15 is, for example, a double-faced adhesive tape, a silicone resin adhesive, or an acrylic resin adhesive.

Pellicle 10 is glued to a mask (not shown) with mask adhesive layer 15 so as to avoid possible attachment of particle to the photomask. When any particle on the photomask is in focus during exposure, it results in poor resolution of the mask patterns on a wafer. Thus, pellicle 10 is attached in such a way as to cover the exposure area of a photomask (not shown).

The photomask (not shown) is, for example, a glass substrate with a patterned light-blocking film. The light-blocking film is a mono- or multilayer film made of metal such as Cr or MoSi. The mask having a patterned blocking mask is the exposure area.

For exposure light used for lithography or other process in which to draw circuit patterns on semiconductor devices, shorter wavelengths of light are employed, such as Hg lamp i-line (365 nm wavelength), KrF excimer laser (248 nm wavelength), or ArF excimer laser (wavelength 193 nm).

The cured electrodeposited coating on the pellicle frame of the present invention has good film strength and corrosion resistance while having good adhesion to metal. It is thus possible to highly prevent dust generation caused by flacking off of the cured electrodeposited coating, and thus to provide a pellicle with good abrasion resistance.

EXAMPLES

Hereinafter, the present invention will be described in detail with reference to Examples and Comparative Examples, which however shall not be construed as limiting the scope of the present invention.

Example 1

As a pellicle frame, an aluminum alloy A7075 frame (outer size: 149 mm×122 mm×5.8 mm, frame thickness: 2 mm) is provided. The surface of the pellicle frame is washed, followed by sand blast treatment at a discharge pressure of 1.5 kg/cm$^2$.

A 10 μm-thick electrodeposited coating is formed on the pellicle frame surface using epoxy resin-based electrodeposition paint Power Top U-CP70 (Nippon Paint Co., Ltd., black matte paint). With the pellicle frame fixed at three points in an electrodeposition chamber, electrodeposition coating is carried out at a coating solution temperature of 28° C. and at impressed voltage of 200V for energization time of 90 seconds. Because electrodeposited coating thickness is subjected to change due to voltage, energization time and degradation level of the electrodeposition coating solution, an optimal coating condition for the coating thickness is determined previously.

The electrodeposited coating is then heated in a 200° C. oven for 60 minutes for curing and drying to afford a cured eletrodeposited coating.

Example 2

A 10 μm-thick electrodeposited coating is formed on the pellicle frame surface as in Example 1 except that epoxy resin-based electrodeposition paint Power Top U-CP70-1 (Nippon Paint Co., Ltd.) is used as electrodeposition paint. A cured electrodeposited coating is formed while changing the thermal curing condition in Example 1 as follows: the electrodeposited coating is heated in a 220° C. oven for curing and drying for 60 minutes, and in aiming to reduce gas generation, it is heated in a 220° C. oven for a further 30 minutes.

Example 3

As a pellicle frame, an aluminum alloy A6061 frame (outer size: 149 mm×122 mm×5.8 mm, frame thickness: 2 mm) is provided. The surface of the pellicle frame is washed, followed by sand blast treatment at a discharge pressure of 1.5 kg/cm$^2$.

A 10 μm-thick electrodeposited coating is formed on the pellicle frame surface using epoxy resin-based electrodeposition paint Power Top U-CP70-5 (Nippon Paint Co., Ltd.). With the pellicle frame fixed at three points in an electrodeposition chamber, electrodeposition coating is carried out at a coating solution temperature of 28° C. and at impressed voltage of 200V for energization time of 80 seconds. Because electrodeposited coating thickness is subjected to change due to impressed voltage, energization time and degradation level of the electrodeposition coating solution, an optimal coating condition for the coating thickness is determined previously.

The electrodeposited coating is then heated in a 200° C. oven for 60 minutes for curing and drying to afford a cured eletrodeposited coating.

Example 4

A 10 μm-thick electrodeposited coating is formed on the pellicle frame surface as in Example 3 except that epoxy resin-based electrodeposition paint Power Top U-CP70-6 (Nippon Paint Co., Ltd.) is used as electrodeposition paint and that energization time is set to 90 seconds. The electrodeposited coating is then heated in a 210° C. oven for 60 minutes for curing and drying to afford a cured eletrodeposited coating.

Example 5

A 13 μm-thick electrodeposited coating is formed on the pellicle frame surface as in Example 3 except that epoxy resin-based electrodeposition paint Power Top U-CP70-7 (Nippon Paint Co., Ltd.) is used as electrodeposition paint and that energization time is set to 100 seconds. The electrodeposited coating is then heated in a 220° C. oven for 60 minutes for curing and drying to afford a cured eletrodeposited coating.

Comparative Example 1

A 12 μm-thick electrodeposited coating is formed on the pellicle frame surface as in Example 1 except that Power Square A Clear Black (acrylic resin paint for anionic electrodeposition (Nippon Paint Co., Ltd.)), is used as electrodeposition paint. As in Example 1, an electrodeposited coating is cured and dried to afford a cured eletrodeposited coating.

Comparative Example 2

A 13 μm-thick electrodeposited coating is formed on the pellicle frame surface as in Example 1 except that acrylic paint ELECOAT AM-1 MAKEUP (SHIMIZU Co., Ltd.) is used as electrodeposition paint. As in Example 1, an electrodeposited coating is cured and dried to afford a cured eletrodeposited coating.

Comparative Example 3

A 13 μm-thick electrodeposited coating is formed on the pellicle frame surface as in Example 1 except that acrylic paint ELECOAT FROSTY W-2 MAKEUP (SHIMIZU Co., Ltd.) is used as electrodeposition paint. As in Example 1, an electrodeposited coating is cured and dried to afford a cured eletrodeposited coating.

Comparative Example 4

WS5100 (Mitsui Chemicals Inc.) as silane-based paint and color black (SHIMIZU Co., Ltd.) are mixed at a weight ratio of 3:0.5 to prepare a mixed paint. Instead of performing the electrodeposition coating process in Example 1, the mixed paint is sprayed onto an aluminum alloy A7075 pellicle frame. With the frame sprayed with the mixed paint being supported at three points on the outside with wires, the frame is heated in a 110° C. oven for 60 minutes for curing and drying to form a silane-based hardcoat on the surface.

Comparative Example 5

An aluminum alloy pellicle frame which is identical to that used in Example 1 is subjected to anodizing treatment on the surface to provide a pellicle frame of Comparative Example 5. By the anodizing treatment, the pellicle frame surface has black matte finish. Note that no electrodeposited coating is formed on the pellicle frame.

Comparative Example 6

A 12 μm-thick electrodeposited coating is formed on the pellicle frame surface as in Example 1 except that epoxy resin-based electrodeposition paint Power Top U-CP70-2 (Nippon Paint Co., Ltd.) is used as electrodeposition paint. As in Example 1, an electrodeposited coating is cured and dried to afford a cured eletrodeposited coating.

Comparative Example 7

As a pellicle frame, an aluminum alloy A6061 frame (outer size: 149 mm×122 mm×5.8 mm, frame thickness: 2 mm) is provided. The surface of the pellicle frame is washed, followed by sand blast treatment at a discharge pressure of 1.5 kg/cm$^2$.

A 11 μm-thick electrodeposited coating is formed on the pellicle frame surface using epoxy resin-based electrodeposition paint Power Top U-CP70-3 (Nippon Paint Co., Ltd.). With the pellicle frame fixed at three points in an electrodeposition chamber, electrodeposition coating is carried out at a coating solution temperature of 28° C. and at impressed voltage of 200V for energization time of 100 seconds. Because electrodeposited coating thickness is subjected to change due to impressed voltage, energization time and degradation level of the electrodeposition coating solution, an optimal coating condition for the coating thickness is determined previously.

The electrodeposited coating is then heated in a 210° C. oven for 60 minutes for curing and drying to afford a cured eletrodeposited coating.

Comparative Example 8

A 13 μm-thick electrodeposited coating is formed on the pellicle frame surface as in Comparative Example 1 except that epoxy resin-based electrodeposition coating Power Top U-CP70-4 (Nippon Paint Co., Ltd.) is used as electrodeposition coating and that energization time is set to 100 seconds. The electrodeposited coating is then heated in a 220° C. oven for 60 minutes for curing and drying to afford a cured eletrodeposited coating.

The pellicle frames coated with cured electrodeposited coating of Examples 1 to 5 and Comparative Examples 1 to 8 are measured for 1) generated gas amount, 2) sulfate ion amount, 3) abrasion test, 4) abrasion test after solvent immersion, and 5) infrared absorption spectrum. The results are given in Tables 1 and 2.

1. Generated Gas Amount

A 30 cm×30 cm square-shaped chamber is placed in a 50° C. temperature-constant vessel, and sets of three pellicle frames with cured electrodeposited coating of Examples and Comparative Examples are placed in the chamber. After purging the chamber with nitrogen, nitrogen gas is kept introduced at a flow rate of 0.1 L/min for 24 hours, allowing generated gas to be trapped on a GC adsorbent-packed column (Tenax TA, GL science Inc.) connected to the nitrogen gas outlet of the chamber. The generated gas is then quantified using a thermal desorption gas chromatography/mass spectrometer (GC/MS). Measurement is carried out using Shimadzu thermal desorption GC-MS (TDTS-2010), Shimadzu gas chromatograph (GC-2010), and Shimadzu mass spectrometer (GCMS-QP2010). The criteria for evaluating generated gas amount are as follows:

Not desirable: generated gas amount is 0.5 μg or more per 3 pellicle frames

Desirable: generated gas amount is 0.4 μg or less per 3 pellicle frames

More desirable: generated gas amount is 0 μg per 3 pellicle frames

2. Sulfate Ion Amount 100 ml of distilled water is placed in heat-resistant zipper bags (Ziplock®, Asahi Kasei Corporation). Sets of three pellicle frames with cured electrodeposited coating from Examples and Comparative Examples are placed in each bag. After de-airing, the bags are sealed with zipper. The heat-resistant bags are immersed in high-temperature (90° C.) water vessel for 3 hours, allowing sulfuric acid contained in the pellicle frame to be extracted into water. The amount of sulfate ions in water is then measured using an ion chromatography analyzer (ICS-1000, DIONEX Corporation). The criteria for evaluating sulfate ion amount are as follows:

Not desirable: sulfate ion amount is 6 μg or more per 3 pellicle frames;

Desirable: sulfate ion amount is 5 μg or less per 3 pellicle frames

More desirable: sulfate ion amount is 0 μg per 3 pellicle frames

3. Wear Test

The pellicle frames with cured electrodeposited coating of Examples and Comparative Examples are cut into plate test pieces each measuring 5.8 mm×10 mm×2 mm. Using a both-way abrasion tester (Tribogear TypeE 30S, SHINTO Scientific Co., Ltd.) and a flat-type SUS mating member (20 mm×20 mm), the coatings are subjected to abrasion testing under the following condition: abrasion speed=30 moves/min, abrasion distance=50 mm, abrasion width=5.8 mm, load=1 kg, number of reciprocations=100, sandpaper grit number=#600 Mitsui Chemicals Inc (DCC type). After abrasion testing, the surface of the test pieces is observed and the width of the remaining cured electrodeposited coating is measured.

More specifically, since the color of the underlying aluminum alloy can be seen at a portion where the coating has been completely scratched off, the portion where the color of the aluminum alloy is seen is judged as the scratched portion. The width (mm) of the black coating remaining on the surface without being completely scratched off after abrasion testing is taken as a measured value. When there is no change in the width of the black coating after abrasion testing and the remaining coating has a width of 5.8 mm, then it is judged that the coating has good abrasion resistance and thus good anti-dust generation performance. On the other hand, when some of the black coating has been scratched off and the remaining coating has a width of 3 mm or less, a pellicle with such a coating undesirably causes dust generation.

4. Wear Test after Solvent Immersion

The pellicle frames with cured electrodeposited coating are cut into plate test pieces each measuring 5 mm×90 mm×2 mm. The test pieces are then immersed in 25° C. tetrahydrofuran in screw test tubes for 2 days, and allowed to stand to dry for 1 day. The test pieces are subjected to abrasion testing in the same manner as described above.

5. Infrared Absorption Spectrum

The pellicle frames with cured electrodeposited coating are cut into plate test pieces each measuring 5.8 mm×90 mm×2 mm. The surface of the test pieces is scraped with a cutter knife to prepare a powder of cured electrodeposited coating. The powder is mixed with fine KBr powder and compressed into a tablet, and then an infrared absorption spectrum is measured by the KBr tablet method under the condition below. The concentration of the coating powder in the tablet is set at 1.2 mg/g.

(Measurement Condition)

Measurement range: 400 cm$^{-1}$ to 4,000 cm$^{-1}$ (one measurement per 1.93 cm$^{-1}$)

Equipment: FTS-165 (Biorad FT-IR)

Integration time: 32

As seen from Table 1, generation of organic acid gas and sulfate ions is not observed for the pellicle frames of Examples 1 to 5. Moreover, even when subjected to normal abrasion test or abrasion test after solvent immersion, the entire or most part of the coating on the test piece remains, proving that the coatings have high abrasion resistance and anti-dust generation performance.

By contrast, generation of sulfate ion or organic acid gas is observed for the pellicle frames of Comparative Examples 1 to 3 and 5. Moreover, it is demonstrated that in the abrasion test of the test pieces of Comparative Examples 1 to 4 and 6 to 8, an area of the cured electrodeposited coating that remains without being completely scratched off becomes smaller, and in the abrasion test after solvent immersion, an area of the cured electrodeposited coating that remains without being completely scratched off becomes much smaller. Most particularly, it can be seen that when even either of the ratio of the absorbance of peak B in the range between 1450 $cm^{-1}$ and 1550 $cm^{-1}$ to the absorbance of peak A in the range between 1200 $cm^{-1}$ and 1275 $cm^{-1}$ (B/A) or the ratio of the absorbance of peak B in the range between 1450 $cm^{-1}$ and 1550 $cm^{-1}$ to the absorbance of peak C in the range between 905 $cm^{-1}$ and 930 $cm^{-1}$ (B/C) in the infrared absorption spectrum falls outside the claimed range, the amount of cured electrodeposited coating that remains after abrasion testing becomes small.

Figure 5:
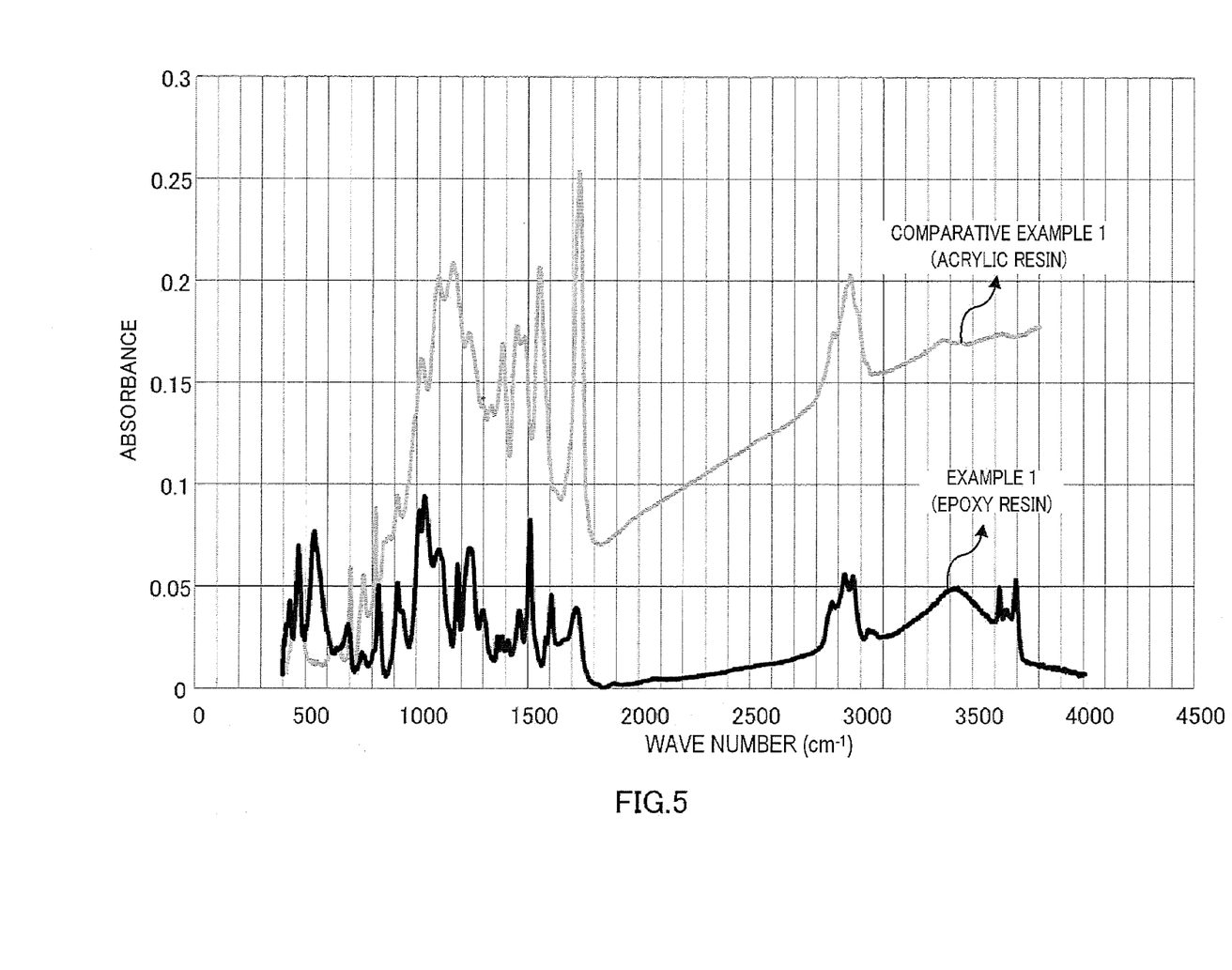
FIG. 5 shows infrared absorption spectra in Examples and Comparative Examples of the present invention.

Referring to the infrared absorption spectra shown in FIG. 5, it can also be seen that the epoxy resin-based cured electrodeposited coating of Example 1 shows distinct peaks. On the other hand, it can be seen that the acrylic resin-based cured electrodeposited coating of Comparative Example 1 at least does not show a peak derived from benzene ring (peak that appears in the range between 1450 $cm^{-1}$ and 1500 $cm^{-1}$), and due to the presence of inorganic substance, it shows broad peak shape.

This application is entitled and claims the priority of Japanese Patent Application No. 2009-168133 filed on Jul. 16, 2009, the disclosure of which including the specification, drawings and abstract is herein incorporated by reference in its entirety.

Industrial Applicability

According to the present invention, it is possible to provide a pellicle that produces less sulfuric acid and outgassing and has less haze caused by sodium sulfate derived from residual sulfuric acid. According to the present invention, it is also possible to provide a pellicle that has moderate film strength and high chemical resistance. The present invention thus can prevent flaking off of coatings due to shock, friction or solvent immersion and can highly prevent dust generation.

| Reference Signs List | |
|---|---|
| 10 | Pellicle |
| 12 | Pellicle Membrane |
| 13 | Membrane Adhesive Layer |
| 14 | Pellicle Frame |
| 15 | Mask Adhesive Layer |

The invention claimed is:

1. A pellicle frame for supporting a periphery of a pellicle membrane, comprising:
an epoxy resin coating formed on a surface of the pellicle frame,
wherein, in an infrared absorption spectrum of the epoxy resin coating, a ratio of an absorbance of peak B in a range between 1450 $cm^{-1}$ and 1550 $cm^{-1}$ to an absorbance of peak A in a range between 1200 $cm^{-1}$ and 1275 $cm^{-1}$ is 0.5 to 3, and a ratio of an absorbance of a peak B in a range between 1450 $cm^{-1}$ and 1550 $cm^{-1}$ to an absorbance of a peak C in a range between 905 $cm^{-1}$ and 930 $cm^{-1}$ is 1 to less than 7.

2. The pellicle frame according to claim 1, wherein the epoxy resin coating is a cured product of an electrodeposited coating of epoxy resin containing a cationic epoxy compound.

3. The pellicle frame according to claim 1, wherein the epoxy resin contains a bisphenol epoxy compound modified with an amine.

4. The pellicle frame according to claim 2, wherein the epoxy resin contains a bisphenol epoxy compound modified with an amine.

5. The pellicle frame according to claim 1, wherein the pellicle frame is a non-anodized aluminum alloy frame.

6. The pellicle frame according to claim 2, wherein the pellicle frame is a non-anodized aluminum alloy frame.

7. The pellicle frame according to claim 1, wherein the epoxy resin coating has a thickness of 25 μm or less.

8. The pellicle frame according to claim 2, wherein the epoxy resin coating has a thickness of 25 μm or less.

9. A pellicle comprising:
a pellicle membrane; and
the pellicle frame according to claim 1 supporting a periphery of the pellicle membrane.

10. A pellicle comprising:
a pellicle membrane; and
the pellicle frame according to claim 2 supporting a periphery of the pellicle membrane.

* * * * *